(12) United States Patent
Barrett et al.

(10) Patent No.: US 7,119,597 B1
(45) Date of Patent: Oct. 10, 2006

(54) METHODS AND APPARATUS TO PRODUCE A VOLTAGE PULSE

(75) Inventors: Robert A. Barrett, Norfolk, MA (US); Patrick J. Ryan, Tamworth (GB)

(73) Assignee: Thermo Electron Corporation, Waltham, MA (US)

( * ) Notice: Subject to any disclaimer, the term of this patent is extended or adjusted under 35 U.S.C. 154(b) by 72 days.

(21) Appl. No.: 10/753,054

(22) Filed: Jan. 7, 2004

(51) Int. Cl.
*G06F 1/04* (2006.01)

(52) U.S. Cl. ...................... 327/291; 324/527
(58) Field of Classification Search ............. 327/291; 324/527
See application file for complete search history.

(56) References Cited

U.S. PATENT DOCUMENTS

| | | | | |
|---|---|---|---|---|
| 4,233,835 A | * | 11/1980 | Dahn | 73/35.17 |
| 4,636,724 A | * | 1/1987 | Fukuda et al. | 324/527 |
| 4,823,088 A | * | 4/1989 | Fukuda | 324/456 |
| 4,875,133 A | * | 10/1989 | Kawamura | 361/230 |
| 5,523,699 A | * | 6/1996 | Miyagawa | 324/765 |

* cited by examiner

*Primary Examiner*—Kenneth B. Wells
(74) *Attorney, Agent, or Firm*—Chapin IP Law, LLC; Barry W. Chapin, Esq.

(57) ABSTRACT

A test circuit employs use of first and second switches to operably charge a capacitor to over 500 volts and, thereafter, discharge energy stored in the capacitor to test an over-voltage protection circuit associated with a pin of a semiconductor device. When switched by a controller, the first switch couples a high voltage source to charge a capacitor. After completing this charge phase, the controller opens the first switch, decoupling the high voltage source from the capacitor. The controller then activates the second switch to couple the capacitor to the pin of the semiconductor device. During this discharge phase, energy in the capacitor discharges through the protection circuit of the semiconductor device. Use of a high-voltage dry reed vacuum relay as the first switch provides better isolation of the high voltage source from the capacitor, avoiding a presence of an unwanted residual voltage component in a simulated ESD test pulse.

32 Claims, 8 Drawing Sheets

CONVENTIONAL TECHNIQUE

METHODS AND APPARATUS TO PRODUCE A VOLTAGE PULSE

BACKGROUND

There continues to be demand for increasingly higher speed electronic components housed in yet smaller and smaller device packages. Smaller device packages translate into greater convenience to a consumer for obvious reasons. One way component manufacturers meet such demands for smaller device packages is by shrinking semiconductor chip geometries and/or increasing the chip's corresponding functionality. As a result of this trend toward smaller packaging and overall chip size, chip device designs (as well as other types of electronic components) are becoming increasingly susceptible to damage by Electrostatic Discharge (ESD). In general, an ESD pulse is a short duration, high-amplitude voltage pulse causing a burst of current to flow between two objects having different electrostatic potentials. Smaller geometries lower the threshold level of an ESD pulse that a corresponding device can handle without causing at least minor stress damage. Consequently, smaller devices are more susceptible to even minimal ESD pulses.

One potential cause of failure associated with electronic devices exposed to ESD is melting of material due to high temperatures. For example, silicon is a very poor conductor. Therefore, even low levels of quick burst energy pulses can cause the material of a semiconductor device to melt down and be permanently damaged. It is worth noting that not all ESD discharges are instantly fatal; certain events will only weaken the device making it more likely to fail early in its useful life.

Another potential cause of failure associated with ESD events is a phenomenon known as punch-through. As its name suggests, this condition results in structural damage due to a hole being blasted through an oxide layer of a semiconductor device as a result of exposure to excessive electrical fields. This phenomenon may also render the semiconductor device inoperable.

Exposure of ESD pulses to chips, electronic circuit boards, and equipment in general is almost inevitable, which is one reason why ESD is presently the leading cause of device failure in the field. Therefore, protection against ESD is typically a major consideration associated with the design, application and purchase of electronic components and, more particularly, sensitive semiconductor devices. Ensuring that devices provide a reasonable and acceptable level of tolerance with respect to ESD is an important part of all device design and manufacturing programs. To determine the ESD threshold of a device, it is necessary to agree on the type of ESD stress for which testing will take place.

FIG. 1 is a diagram of an electronic circuit 100 illustrating a conventional technique of testing a semiconductor device according to MIL-STD-883E (Military Standard 883E). This standard and corresponding specified circuit simulate ESD according to the Human Body Model (HBM). Other common standards that specify different types of ESD for testing an integrated circuit include the Machine Model (MM) and the Charged Device Model (CDM). Each of these models has an associated specification that defines the circuit components (e.g., resistive, capacitive, and inductive components) to shape the corresponding test waveform. Each of these models also has an associated specification including procedures to be used for testing electronic circuit components.

In general, generation of a simulated HBM or MM ESD pulse according to the standards involves two phases. During a charging phase, switch S1 is set so that conductive throw lead 115 couples node A to node B. Thus, capacitor C1 charges to a voltage produced by high voltage source 110. In a following discharge phase, switch S1 is set so that conductive throw lead 115 couples node B to node C. This causes energy in capacitor C1 to discharge through resistor R2 to the device under test 140. The HBM standards specify the values to be used in the circuit elements R2 and C1.

FIG. 2 is a graph illustrating a comparison of an exponential decay voltage waveform 220 and a simulated ESD test pulse 210 produced by the conventional circuit in FIG. 1. The voltage waveforms are similar except the simulated ESD test pulse 210 generally includes an unwanted residual voltage component 215 (e.g., a 2.5 volt plateau for a duration, T1, of 500 microseconds) superimposed on the exponential decay voltage waveform 220. It should be noted that a magnitude of the residual voltage component 210 may vary depending on a load of device under test 140 that test apparatus 100 drives. Also, relevant standards (e.g., MIL-STD, JEDEC, and ESD Association) specify a test voltage waveform as a current pulse into a short circuit. Characteristics of a produced test voltage pulse may vary depending on presence of non-short-circuit load conditions.

SUMMARY

Conventional techniques for generating simulated ESD test pulses suffer from certain deficiencies. For example, conventional electronic theory suggests that the electronic circuit 100 in FIG. 1 that generates simulated ESD pulses as specified by MIL-STD-883E would produce an exponential decay voltage waveform as shown by dotted line 220 in FIG. 2. However, precise measurement of the waveform produced by the conventional circuit 100 indicates an unwanted residual voltage component 215 (i.e., a 2.5 volt plateau for a duration of 500 microseconds) within the waveform. Depending on an associated magnitude and duration, the presence of the residual voltage component 215 may cause damage to or incorrect operation of the device under test 140.

As an example, in one conventional application, the device under test 140 is a semiconductor device having an internal protection circuit associated with a corresponding pin or pins of the semiconductor device. The purpose of the internal protection circuit is to be activated when the semiconductor device is exposed to an ESD pulse in order to dissipate the pulse so the device is not damaged. Specifically, when a pin of the semiconductor device is "zapped" with a high voltage simulated ESD test pulse, the internal protection circuit in the semiconductor device shunts the high voltage spike to ground so that other internal circuitry of the semiconductor device is not damaged or stressed due to high voltage. Unfortunately, the residual voltage component 215 (i.e., the 2.5 volt plateau of 500 microsecond duration) superimposed on the exponential decay waveform (e.g., the simulated ESD test pulse) induced by the conventional circuit 100 causes continued activation of the internal ESD protection circuit thus producing a prolonged exposure of unnecessary high voltage above what is specified for testing the protection circuit of the semiconductor device. For example, it has been learned that an initial voltage spike of up to 8000 volts initially activates the conventional internal protection circuit associated with a pin of the conventional semiconductor device to turn ON and shunt the excessive voltage. This protects the internal circuitry of the device under test from the initial ESD spike. However, the residual voltage component 215, if above a threshold level 230 too long, may keep the internal ESD protection circuit turned ON too long and stress the protection circuit or other parts of the semiconductor device containing the protection circuit beyond an acceptable limit. This can result in damage to the device under test 140 as a result of an electrical overstress condition.

Many factors may contribute to producing the residual voltage component 215 during a simulated ESD test pulse cycle. For example, switch S1 in FIG. 1 may unnecessarily leak or couple energy from high voltage source 110 to the device under test 140 when switch S1 couples the capacitor C1 to the device under test 140. Specifically, energy produced by high voltage source 110 may leak from node A to node C even though conductive throw lead 115 closes a circuit path between node B and node C during a discharge phase when the simulated ESD pulse is generated. Note that even during the discharge phase, the high voltage source 110 may continue to generate a high voltage signal such as 8000 volts similar to that generated when charging the capacitor C1 during a charge phase (i.e., when node A and node B are electrically connected via conductive throw lead 115). Typically, switch S1 is a glass-encapsulated mercury switch filled with gas. The gas (e.g., an ionized gas) may provide a conductive bridge between node A and node C, thus leaking energy generated by the high voltage source 110 through switch S1 even when in an OPEN state when, in theory, it should not support a conductive path. Thus, it is not inconceivable that the high voltage source 110 plays a substantial role in generating the residual voltage component 215.

Embodiments of the present invention significantly overcome such deficiencies and are directed towards minimizing a residual voltage component below a threshold so that the device under test is not unnecessarily damaged or stressed during exposure to a simulated ESD test pulse. More specifically, according to one example embodiment of the invention, a test apparatus employs use of a first switch device and second switch device to operably charge a capacitor or other energy storage device to, for example, 8000 volts and, thereafter, apply energy stored in the capacitor to test an over-voltage protection circuit associated with a pin of a semiconductor device (or other device under test). For example, the first switch device may be a high voltage dry reed vacuum relay that, when switched by a controller, couples a high voltage source to charge the capacitor. After completing a charge phase, the controller opens the first switch so that the high voltage source is substantially isolated from the charged capacitor. The controller then activates the second switch to couple the charged capacitor to the pin of the semiconductor device under test. During this discharge phase, energy in the capacitor discharges through the protection circuit of the semiconductor device under test, simulating exposure of the pin of the semiconductor device to an ESD condition such as that based on the Human Body Model.

Characteristics of the first and second switches (e.g., based on type) as well as placement of such switches in a test apparatus to generate the simulated ESD test pulse are examples of features that distinguish embodiments of the invention over conventional techniques for ESD pulse generation. For example, unlike conventional techniques, mere use of both the first and second switch (in lieu of a single switch as in ML-STD-883E) according to an embodiment of the invention provides for better isolation as opposed to a single switch as specified by MIL-STD-883E. Further, unlike conventional techniques, one embodiment of the invention employs use of a high voltage dry reed vacuum relay (e.g., a switch providing little or no leakage when it is in an OPEN state) to selectively couple/decouple the high voltage source to/from the capacitor, which stores energy to generate the simulated ESD test pulse. Use of the high voltage dry reed vacuum relay (e.g., as the first switch) provides better isolation of the high voltage source from the capacitor, avoiding generation of unwanted residual voltage components in the simulated ESD test pulse.

In view of the foregoing discussion and detailed description of the invention that follows, a more general embodiment of the invention is directed towards a test apparatus that generates a voltage pulse for testing an electronic device susceptible to electrostatic discharge. The test apparatus includes a power source operable to generate a voltage signal. An energy storage device receives the voltage signal through a first switch device that is operated to selectively couple the power source to the energy storage device such as a capacitor. The test apparatus further includes a second switch device that selectively couples the energy storage device to the electronic device to be tested. The second switch device supports transfer of energy from the energy storage device to produce the voltage pulse for testing an electrostatic discharge protection circuit of the electronic device. That is, the second switch couples the energy storage device to electronic device under test. In combination, the first and second switches limit a residual voltage component present in the voltage pulse after an initial discharge of energy stored in the energy storage device through the electrostatic discharge protection circuit, the residual voltage component being at a level low enough (e.g., below a predetermined threshold) to result in substantial deactivation of the electrostatic discharge protection circuit of the electronic device to avoid damage.

In the context of an ESD test simulator, the test apparatus produces a voltage pulse that simulates an ESD (Electrostatic Discharge) pulse such as the Human Body Model as specified in MIL-STD-883E. Additionally, embodiments of the present invention are directed towards a test apparatus that simulates an ESD pulse such as those specified by EIA/JEDEC, JESD22-A114-B, and/or ESDA STM5.1 1998.

The test apparatus may further include a controller to control the first switch device and the second switch device. During operation such as when generating a test voltage pulse, the controller performs sequential switch control operations. For example, the controller initially opens the second switch device to substantially decouple the energy storage device from the electronic device. Thereafter, the controller closes the first switch device to substantially couple the power source to the energy storage device to charge the energy storage device. While in this mode, the voltage signal generated by the power source charges the energy storage device. After the energy storage device is charged, the control opens the first switch device to substantially decouple the energy storage device from the power source. Thereafter, the controller closes the second switch device to substantially couple the energy storage device to test the electronic device with a test voltage pulse produced as a result of discharging the energy storage device.

In one application, the controller generates a common signal that simultaneously controls the first switch device to an OPEN position and the second switch device to a CLOSED position. Conversely, the controller may produce the common control signal to simultaneously control the first switch device to an CLOSED position and the second switch device to an OPEN position. In general, use of a common control signal to control the first switch and second switch saves resources as a result of sharing. Of course, each switch device may be controlled by individual control signals. Such an embodiment enables more precise timing control of when switches are OPEN and CLOSED.

Depending on the embodiment, the first switch and second switch may be normally open (e.g., the default position of a switch is an OPEN circuit when no control signal is applied) or normally closed (e.g., the default position of a switch is a CLOSED circuit when no control signal is applied).

In further embodiments, operation of the test apparatus including the combination of the power source, the first switch device, the second switch device, and the energy storage device results in generation of the test voltage pulse as discussed. The generated test voltage pulse may include a residual voltage component superimposed on a substantial exponential decay voltage waveform. In general, the combination of components in test apparatus as well as characteristics of the first switch ensure that any residual voltage component in the test voltage pulse is below a predetermined threshold value. If the residual voltage component were otherwise above the predetermined threshold longer than an acceptable duration of time, an electrostatic discharge protection circuit of the electronic device under test may be held in an active state too long, thus resulting in damage to the device under test. In one application, the first switch device substantially decouples the power source from the energy storage device during a discharge phase so that the residual voltage component is less than 0.4 volts (below which the protection circuit associated with the pin of the semiconductor device shuts off because it no longer needs to protect a tested pin from an over-voltage condition). It should be noted that the predetermined threshold will vary depending on the application.

In a specific embodiment as mentioned, the first switch device is a high-voltage, dry reed vacuum relay device and the second switch device is a high-voltage, gas-filled mercury relay device. Based on implementing the test apparatus using these components, the test voltage pulse (e.g., simulated ESD pulse) is substantially an exponential decay waveform including a residual voltage component below a specified threshold such as 0.4 volts. The threshold voltage may be a level under which it is known that a protection circuit receiving the test voltage pulse will shut off. More specifically, below a predetermined voltage threshold, the protection circuit under test discontinues shunting current to ground to prevent internal damage to a corresponding semiconductor device being tested. Testing a protection circuit with such a pulse (having a residual component voltage below a threshold value) prevents unnecessary stress or damage because the protection circuit is not turned on for an excessive period of time following an activating high voltage pulse.

As mentioned, one purpose of using a dry reed relay device as the first switch device is to substantially decouple the power source from the energy storage device when the energy storage device delivers energy to test a protection circuit of a semiconductor device. For example, when in the OPEN switch state, the first switch device sufficiently isolates the power source from the energy storage device so that any residual voltage component imparted by energy leaking from the power source through the switch device to the protection circuit is below a threshold value to prevent damage to the protection circuit being tested.

In one embodiment, the power source producing a high voltage to initially charge the energy storage device is (further) isolated from the device under test by shunting excess energy otherwise imparted by the power source to ground. More specifically, an embodiment of the test apparatus includes a third switch device to shunt residual energy generated by the power source to ground while the second switch is activated to couple the energy storage device to the electronic device to produce the voltage pulse and while the first switch device is open. Thus, excess energy from the power source is shunted to ground rather than coupled to the device under test.

Testing semiconductor devices can be challenging due to the difficulty of being able to generate repeatable test pulses having rise times on the order of nanoseconds. Techniques discussed herein are particularly well-suited for generating repeatable test pulses that do not unnecessarily damage semiconductor devices. Generation of simulated test pulses according to an embodiment of the invention ensures that a device is sufficiently tested for ESD protection, but not overstressed potentially resulting in early part failure.

Semiconductor device pin counts have increased dramatically. Consequently, the process of testing such devices can be time consuming, potentially requiring hours or even days to completely test all pins (each of which includes an over-voltage protection circuit) of a device. As mentioned, techniques discussed herein are particularly well-suited for producing highly repeatable (i.e., successively generated waveforms are very similar) simulated ESD test pulses. In addition to repeatability, the test circuit according to embodiments of the invention is well-suited for use in manufacturing applications because it is inexpensive, reliable and has a fast recovery time. Another attribute of the test circuit is its small form factor. Because it is compact in size, a single test unit including many such test circuits may be housed in a relatively small test system, while still providing a test manufacturer the ability to simultaneously test multiple pins or multiple semiconductor devices.

BRIEF DESCRIPTION OF THE DRAWINGS

The foregoing and other objects, features and advantages of the invention will be apparent from the following more particular description of embodiments of the invention, as illustrated in the accompanying drawings and figures in which like reference characters refer to the same parts throughout the different views. The drawings are not necessarily to scale, emphasis instead being placed upon illustrating the embodiments, principles and concepts of the invention.

DETAILED DESCRIPTION OF THE INVENTION

Embodiments of the invention operate in part to minimize a residual voltage component (which is superimposed on an exponential decay waveform) below a threshold so that a device under test is not unnecessarily damaged or stressed during exposure to a simulated ESD test pulse. For example, in a specific embodiment of the invention, a test circuit employs use of first and second switches to operably charge a capacitor to, for example, 8000 volts and, thereafter, discharge energy stored in the capacitor to test an overvoltage protection circuit associated with a pin of a semiconductor device. When switched by a controller, the first switch couples a high voltage source to charge a capacitor. After completing this charge phase, the controller opens the first switch, decoupling the high voltage source from the capacitor. The controller then activates the second switch to an ON state and couples the charged capacitor to the pin of the semiconductor device. During this discharge phase, energy in the capacitor discharges through the protection circuit of the semiconductor device. Use of a high-voltage dry reed vacuum relay as the first switch (to initially charge the capacitor) provides isolation of the high voltage source from the capacitor, resulting in reduction of an unwanted residual voltage component in a simulated ESD test pulse.

Figure 3:
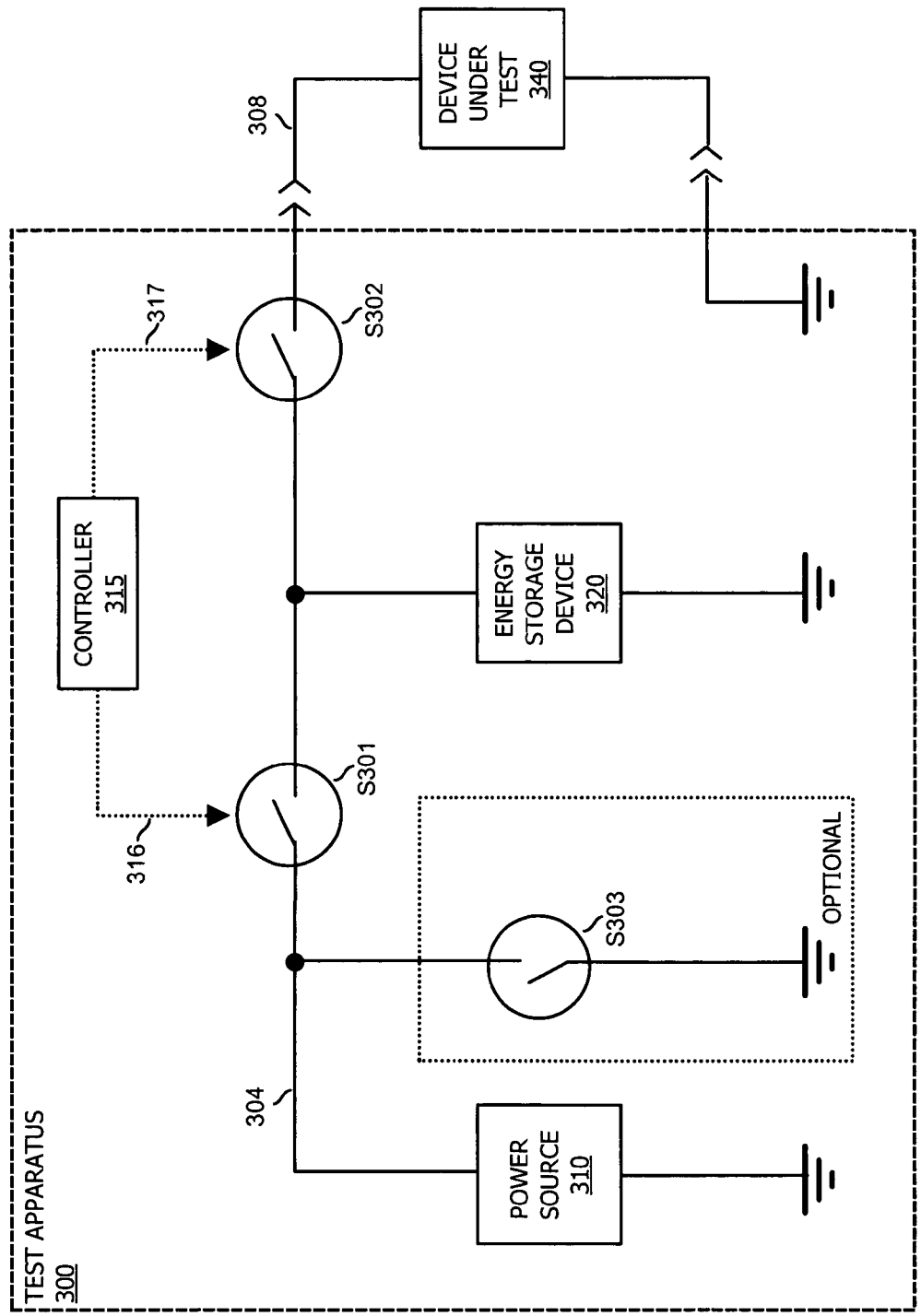
FIG. 3 is a diagram of a test apparatus for generating an improved test voltage pulse according to a general embodiment of the invention.

FIG. 3 is a diagram of a test apparatus 300 for generating an improved simulated ESD test voltage pulse according to a general embodiment of the invention. As shown, test apparatus 300 includes power source 310, switch device S301, switch device S302, controller 315, energy storage device 320, and optional switch device S303 coupled to ground. In general, proper operation of switch devices S301 and S302 produces an output test voltage pulse which is applied over line 308 (e.g., an electrical conductor such as a wire or circuit trace) to a device under test 340.

During operation, energy storage device 320 receives a voltage signal along line 304 through switch device S301 (e.g., a high voltage dry reed relay) that is operated to selectively couple the power source 310 to energy storage device 320. Energy storage device 320 may be, for example, a 100 picofarad, 10,000 volt capacitor.

Test apparatus 300 further includes switch device S302 (e.g., a high voltage mercury relay filled with SF-6 (Sulfur HexaFlouride) gas) that selectively couples the energy storage device 320 to the electronic device under test 340 such as a semiconductor device. The switch device S302 supports transfer of energy from the energy storage device 320 to produce the output test voltage pulse applied over line 308 for testing an electrostatic discharge protection circuit of the device under test 340. That is, when activated, switch device S302 couples the energy storage device to electronic device under test 340. In the context of producing ESD test pulses, the test apparatus 300 produces successive output test voltage pulses that simulate an ESD (Electrostatic Discharge) pulse such as the Human Body Model as specified in MIL-STD-883E. Test apparatus 300 may also be used to produce ESD test pulses according to standards such as EIA/JEDEC, JES22-A114-B, and ESDA STM5.1 1998. More details of how the above switching process produces the output test voltage pulse are discussed below.

Test apparatus 300 includes a controller 315 to control switch device S301 and switch device S302. In one embodiment, switch devices S301 and S302 are glass encapsulated mechanical relays in which a state (e.g., OPEN or CLOSED position) of the switch device depends on application of a magnetic field. More specifically, control signals 316 and 317 may be magnetic fields inducing internal conductive leads of respective switch devices S301 and S302 together or apart. When leads of a respective switch device touch each other (e.g., CLOSED position), a low impedance path is formed.

Figure 4:
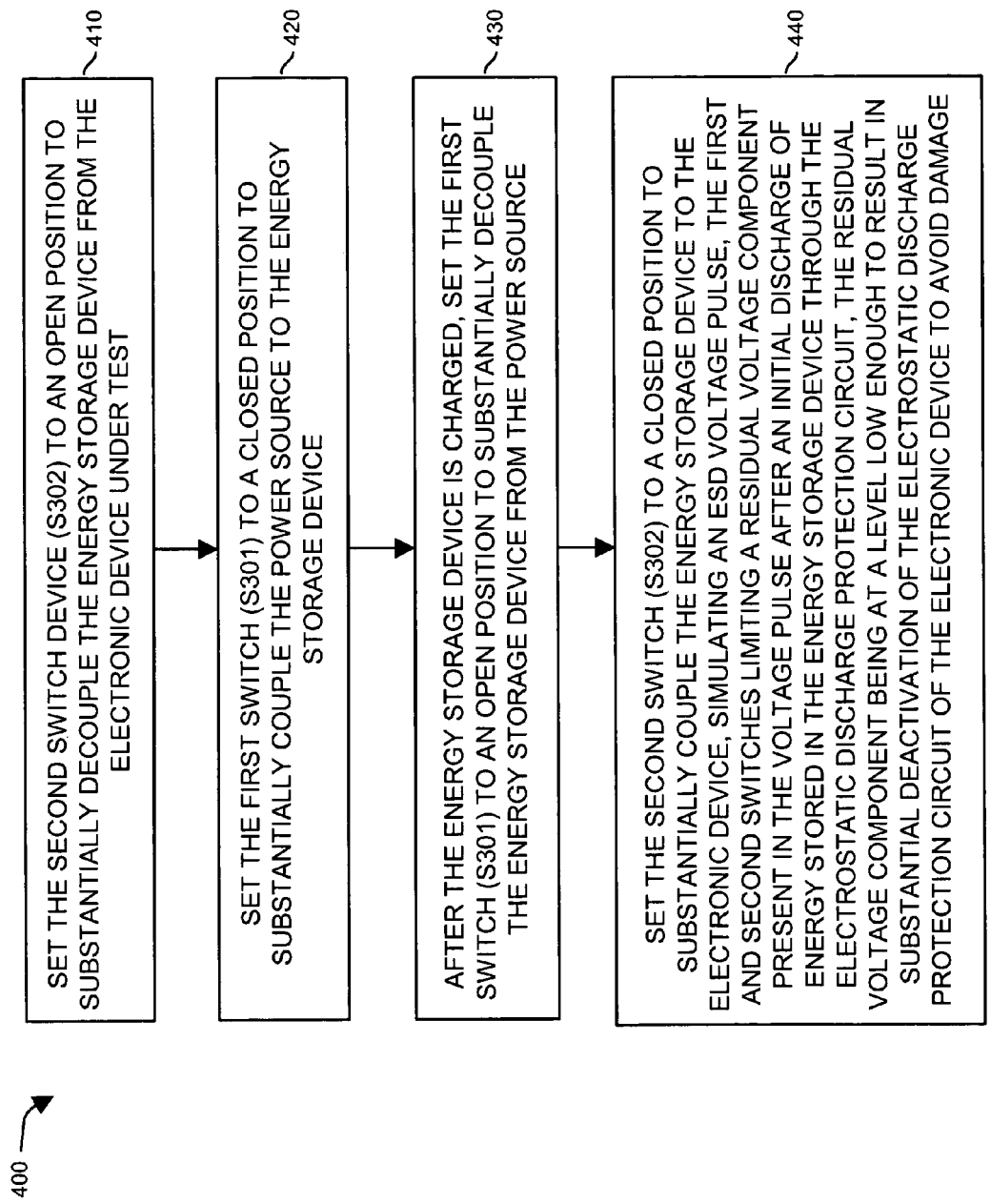
FIG. 4 is a flow chart illustrating switch control operations for generating an improved test voltage pulse according to an embodiment of the invention.

FIG. 4 is a flowchart 400 illustrating how the controller 315 controls operation of switch devices S301 and S302 via respective control signals 316 and 317.

During operation of the test apparatus 300, the controller 315 performs sequential switch control operations. For example, in step 410 of FIG. 4, the controller 315 initially generates control signal 317 to OPEN switch device S302 to substantially decouple the energy storage device 320 from the device under test 340.

In step 420, the controller 315 generates control signal 316 to CLOSE switch device S301 to substantially couple the power source 310 to the energy storage device 320. While the test apparatus is in this mode, the power source 310 charges the energy storage device 320. As mentioned, the storage device 320 may be charged to 8000 volts or more.

After the energy storage device 320 is charged in step 420, in following step 430, the controller 315 generates control signal 316 to OPEN switch device S301 to substantially decouple the energy storage device 320 from the power source 310.

Thereafter (or concurrently with step 430), in step 440, the controller 315 generates control signal 317 to CLOSE switch device S302 to substantially couple (the charged) energy storage device 320 to test the electronic device under test 340 with an output test voltage pulse produced as a result of discharging the energy in energy storage device 320.

In one application, the controller 315 generates a common signal that simultaneously controls switch device S301 to an OPEN position and switch device S302 to a CLOSED position. Conversely, the controller 315 may produce a common control signal to simultaneously control switch device S301 device to a CLOSED position and switch device S302 to an OPEN position. In general, use of a common control signal to control switch devices S301 and S302 saves overall resources required to implement test apparatus 300.

Separate signals may also be used to control respective switch devices S301 and S302. Also, depending on the embodiment, switch device S301 and switch device S302 may be normally OPEN (e.g., the default position of a switch is OPEN when no control signal is applied) or normally CLOSED (e.g., the default position of a switch is CLOSED when no control signal is applied).

Test apparatus 300 optionally includes switch device S303 to provide extra isolation between power source 310 and energy storage device 320 during a discharge phase when with device S301 is OPEN and switch device S302 is CLOSED. More specifically, optional switch device S303 may be turned ON during the discharge phase (when S301 is OPEN and S302 is CLOSED) to shunt any excess voltage (or current) generated by power source 310 to ground so that only energy stored in energy storage device 320 couples to device under test 340 and not energy stored in switch device S301 (e.g., based on capacitance) or residual energy generated by power source 310.

More specific embodiments of the invention will now be discussed with respect to FIGS. 5–7. These embodiments further demonstrate techniques to minimize undesirable energy storage in parasitic circuit elements associated with the physical realization of the switch devices S301 and S302 and the energy storage device 320 of FIG. 3. This undesirable energy storage can be source of the residual voltage component 210 in FIG. 2.

Figure 5:
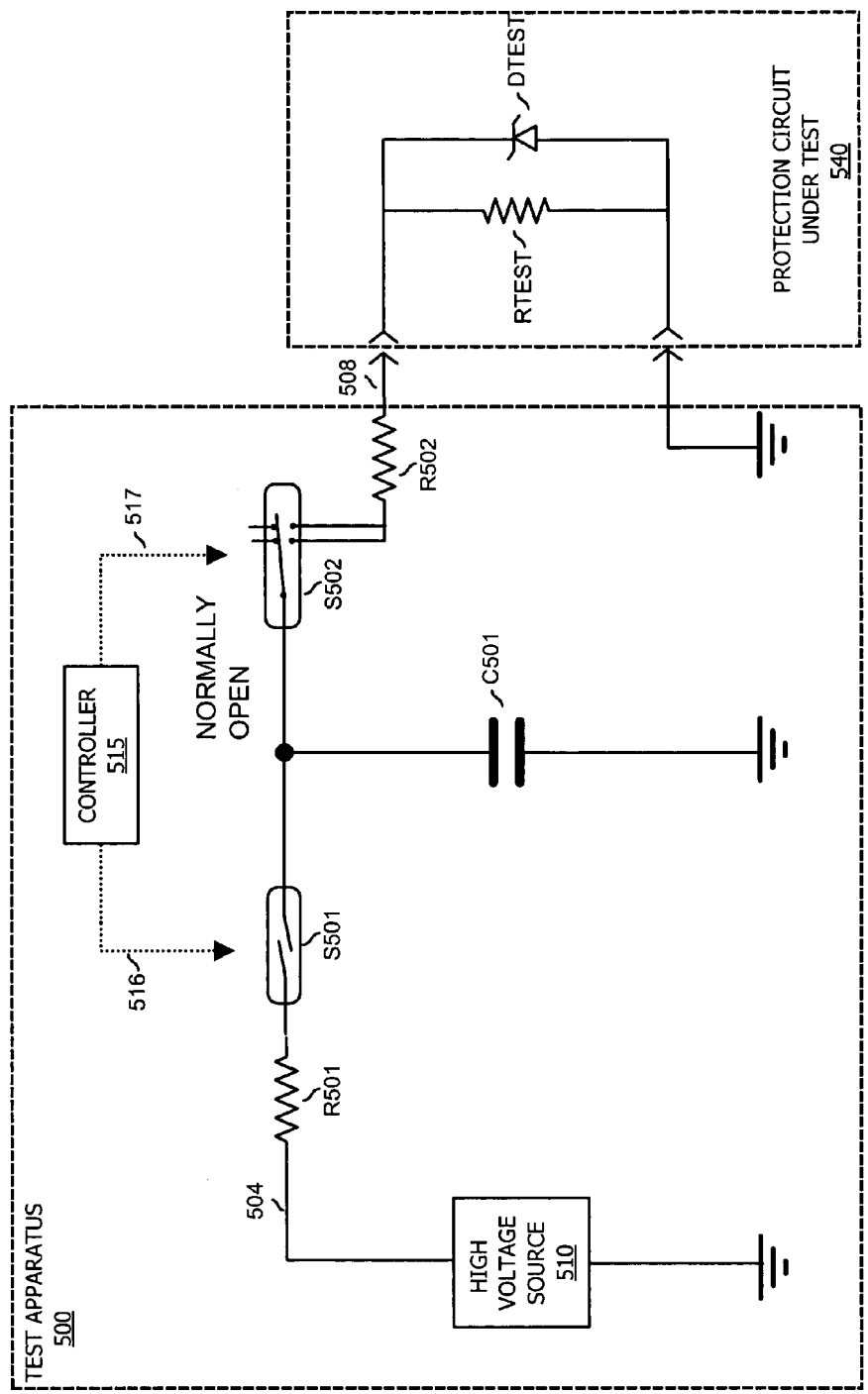
FIG. 5 is a circuit diagram of a test apparatus for generating a voltage pulse according to an embodiment of the invention.
Figure 8:
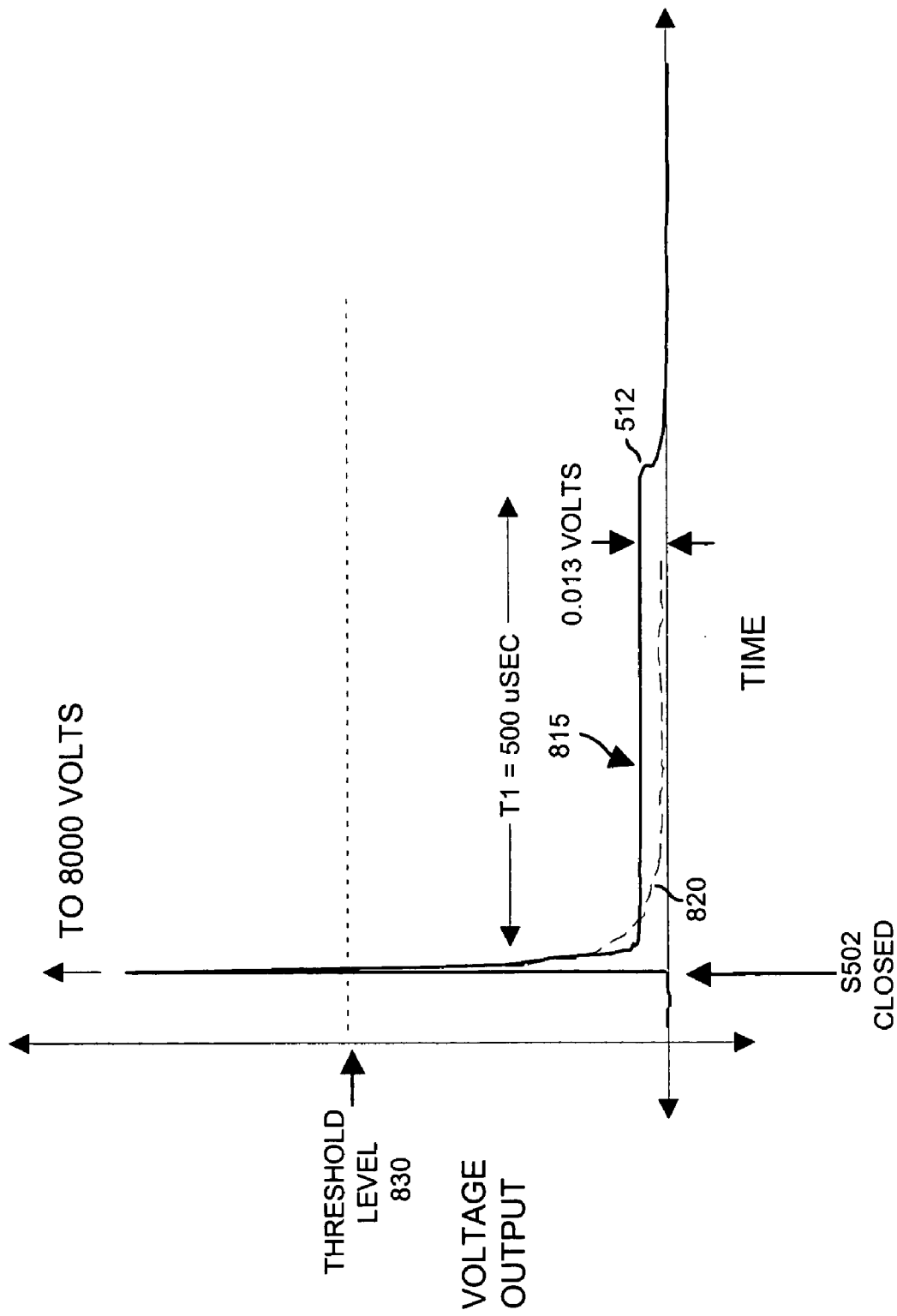
FIG. 8 is a graph illustrating the improved test voltage pulse according to an embodiment of the invention.

FIG. 5 is a circuit diagram of test apparatus 500 for generating an output test voltage pulse to be applied over line 508 according to an embodiment of the invention. As shown, test apparatus 500 includes high voltage source 510, resistor R501, switch device S501, switch device S502, controller 515, capacitor C501, and resistor R502. FIG. 8 is a graph illustrating a comparison of an output test voltage pulse 512 as generated by test apparatus 500 according to an embodiment of the invention to an ideal exponential decay waveform 820 for testing electronic parts such as protection circuit under test 540 (e.g., RTEST may be a 10 Kilo-ohm resistor while diode DTEST may be a zener diode device having a reverse breakdown voltage on the order of volts).

Switch device S501 may be a reed relay including reeds (i.e., electrical contacts) disposed in a glass encapsulated relay device. A reed relay is activated (i.e., the reeds are forced to contact each other) depending on the application of a magnetic field. Switch S502 may be a high voltage mercury relay device filled with SF-6 (Sulfur HexaFlouride) gas. Resistors R501 and R502 (e.g., R501 may be a 1 mega-ohm resistor and R502 may be a 1.5 kilo-ohm resistor as in a standard HBM network) limit the amount of current which flows during the charge and discharge phases, and R502 together with C501 shapes the simulated ESD pulse.

Figure 2:
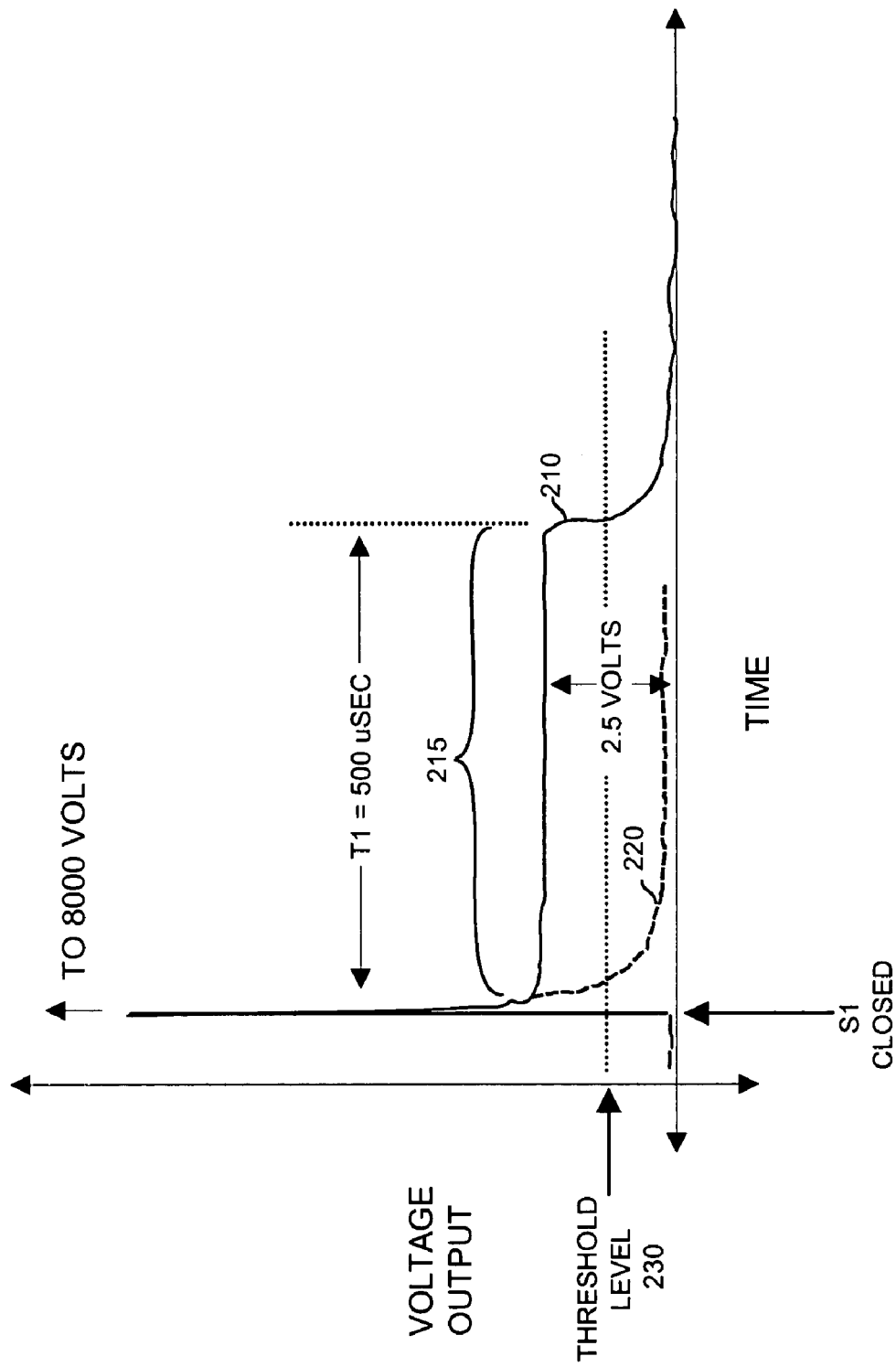
FIG. 2 is a graph illustrating a residual voltage component superimposed on an exponential decay waveform according to conventional techniques.

Operation of test apparatus 500 is similar in some respects to that discussed for test apparatus 300 shown in FIG. 3. However, FIG. 5 includes more specific types of electronic switching components according to an embodiment of the invention. For example, switch device S501 of test apparatus 500 may be a high voltage (vacuum) dry reed relay device. In general, use of a dry reed relay device as switch device S501 provides better isolation between high voltage source 510 and capacitor C501 when switch device S501 is in an OPEN switch position. Accordingly, the residual voltage component 215 (which can needlessly damage certain types of semiconductor protection circuits) as shown in FIG. 2 can be substantially reduced according to embodiments of the invention, as further illustrated in FIG. 8. Recall that a conventional technique employs a gas-filled mercury switch device that may potentially leak.

Switch device S501 may be a vacuum relay device by Gigavac, part number GR5LTA335. Switch device S502 may be a mercury relay device by C. P. Clare, part number 108174-00. It should be noted that many other similarly functioning electrical components can be used in their place.

FIG. 8 illustrates a reduced residual voltage component 815 (as produced by test apparatus 500 according to an embodiment of the invention) compared to a more pronounced residual voltage component 215 in FIG. 2 according to conventional techniques. Reduction of the residual voltage component 815 below threshold level 830 via use of a vacuum dry reed relay (as switch device S501) ensures that simulated protection circuit under test 540 (e.g., a load simulating a protection circuit associated with a pin of a semiconductor device) and, more specifically, diode DTEST is not needlessly activated for an extended duration after an initial high voltage spike during a discharge cycle. Note that protection circuit under test 540 merely simulates a load of a pin input of a semiconductor device for illustrative purposes. In a manufacturing environment, test apparatus 500 would be used to test pin inputs of a semiconductor device or other component. Moreover, techniques discussed herein may be employed in other than testing types of environments.

Figure 1:
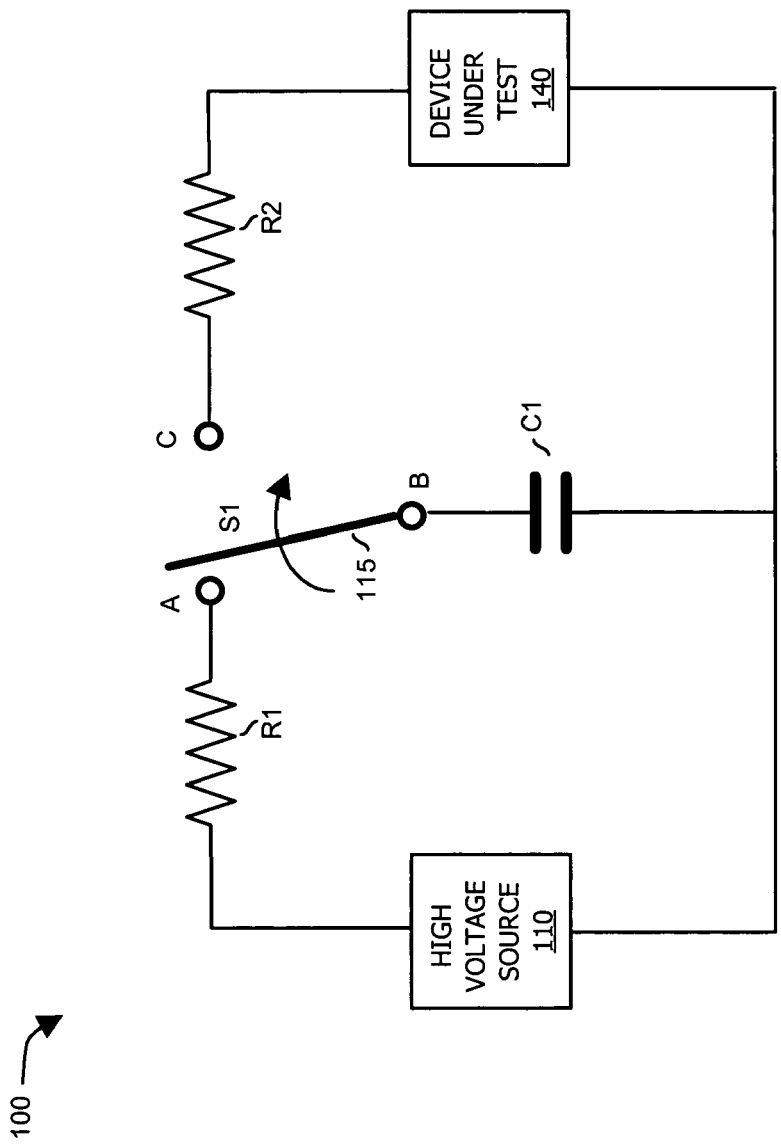
FIG. 1 is a test circuit diagram for generating simulated ESD pulses according to conventional techniques.

Note that conventional test apparatus as illustrated in FIG. 1 results in generation of a residual voltage component 215 (in corresponding FIG. 2) above threshold level 230 for a duration of 500 microseconds. The threshold level 230 identifies a level above which the protection circuit under test 140 is actively shunting energy to ground. Thus, the initial voltage spike of 8000 volts turns an over-voltage protection circuit of device under test 140 to an ON state. Following an initial dissipation of the 8000 volt spike, the over-voltage protection circuit of device under test 140 needlessly remains in an active state (because residual voltage component 215 is above threshold 230) for an additional 500 microseconds. As discussed, a presence of the residual voltage component 215 for 500 microseconds superimposed on the ideal exponential decay waveform 210 causes the protection circuit (e.g., device under test 140) to remain in an extended active state causing internal heat to build up, potentially damaging the device under test 140.

In comparison, the residual voltage component 815 (as shown in FIG. 8 and as generated by test apparatus 500) is below threshold level 830 during the 500 microsecond period of time following the initial voltage spike. Thus, following an initial dissipation of the simulated ESD voltage spike, the device under test (e.g., protection circuit under test 540) does not needlessly remain in an active state for the additional 500 microseconds time period and thus is not needlessly overstressed during testing.

In one illustrative application, switch device S501 substantially decouples the high voltage source 510 from capacitor C501 during a discharge phase so that the residual voltage component 815 is less than 0.4 volts (below which, the protection circuit shuts off). Note that there is no need for the protection circuit under test 540 to be ON during the 500 microsecond timeframe because, at the voltage of around 0.4 volts, a corresponding pin of the device under test is no longer in danger of being damaged.

Although 0.4 volts is used in the above example, note that the threshold value 830 may vary depending on the application. For example, a protection circuit to be tested may have different breakdown voltages. Also, it should be noted that the residual voltage component 815 may vary depending on characteristics of the device under test. For example, if DTEST has a higher reverse breakdown voltage, the residual voltage component 815 will be higher in magnitude. Conversely, if DTEST has a lower reverse breakdown voltage, the residual voltage component 815 will be lower in magnitude.

Figure 6:
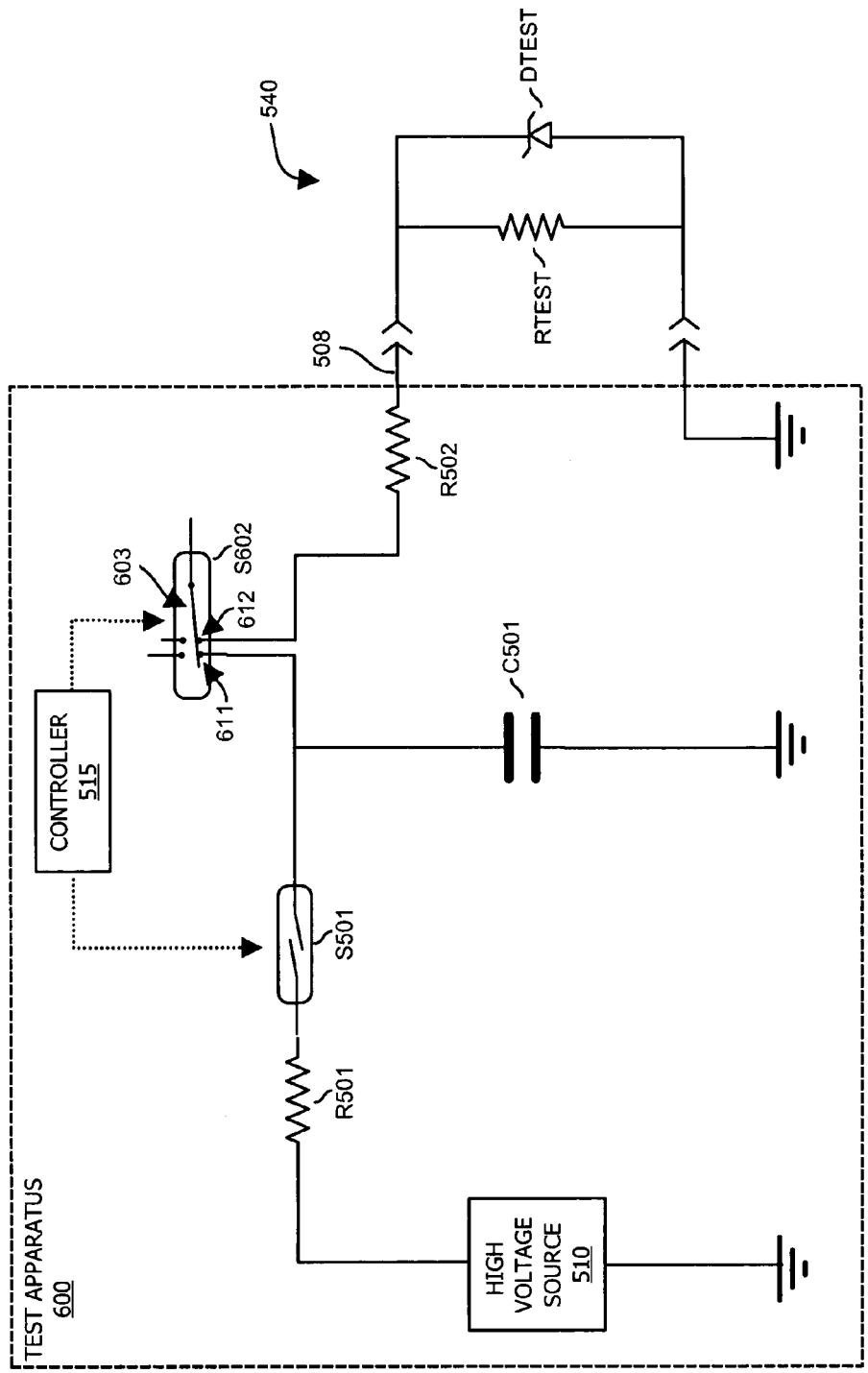
FIG. 6 is a circuit diagram of a test apparatus for generating a voltage pulse according to an embodiment of the invention.

FIG. 6 is a circuit diagram of test apparatus 600 for generating an output test voltage pulse to be applied over line 508 according to an embodiment of the invention. As shown, test apparatus 600 is for the most part identical to test apparatus 500 shown in FIG. 5. However, switch S602 is uniquely configured to couple capacitor C501 to protection circuit under test 540 during the discharge phase. For example, the second switch device S602 (e.g., a gas filled mercury switch device) includes a conductive throw lead 603 that selectively moves to a biased and unbiased position depending on application of a magnetic field initiated by controller 510. As shown, conductive throw lead 603 is in a biased position.

Switch device S602 includes a first contact 611 and a second contact 612 disposed in relation to a distal end of the movable conductive throw lead 603. As shown, the first contact 611 is coupled to capacitor C501 and the second contact 612 is coupled through resistor R502 to the protection circuit under test 540. The throw lead 603, while in the biased position, couples the first contact 611 to the second contact 612 of switch device S602 via a length of the conductive throw lead 603, thereby completing a conductive path from capacitor C501 through the first contact 611, through the length of the conductive throw lead 603, through the second contact 612 and resistor R502 and along line 508 to the protection circuit under test 540. The throw lead 603, while in the unbiased position (e.g. when thrown to an opposite position than as shown), breaks a connection between the first contact 611 and the second contact 612. In this mode, switch device S602 decouples the capacitor C501 from the circuit under test 540, thereby preventing a flow of energy from capacitor C501 (and high voltage source 510) to the protection circuit under test 540 through the length of the conductive throw lead.

Figure 7:
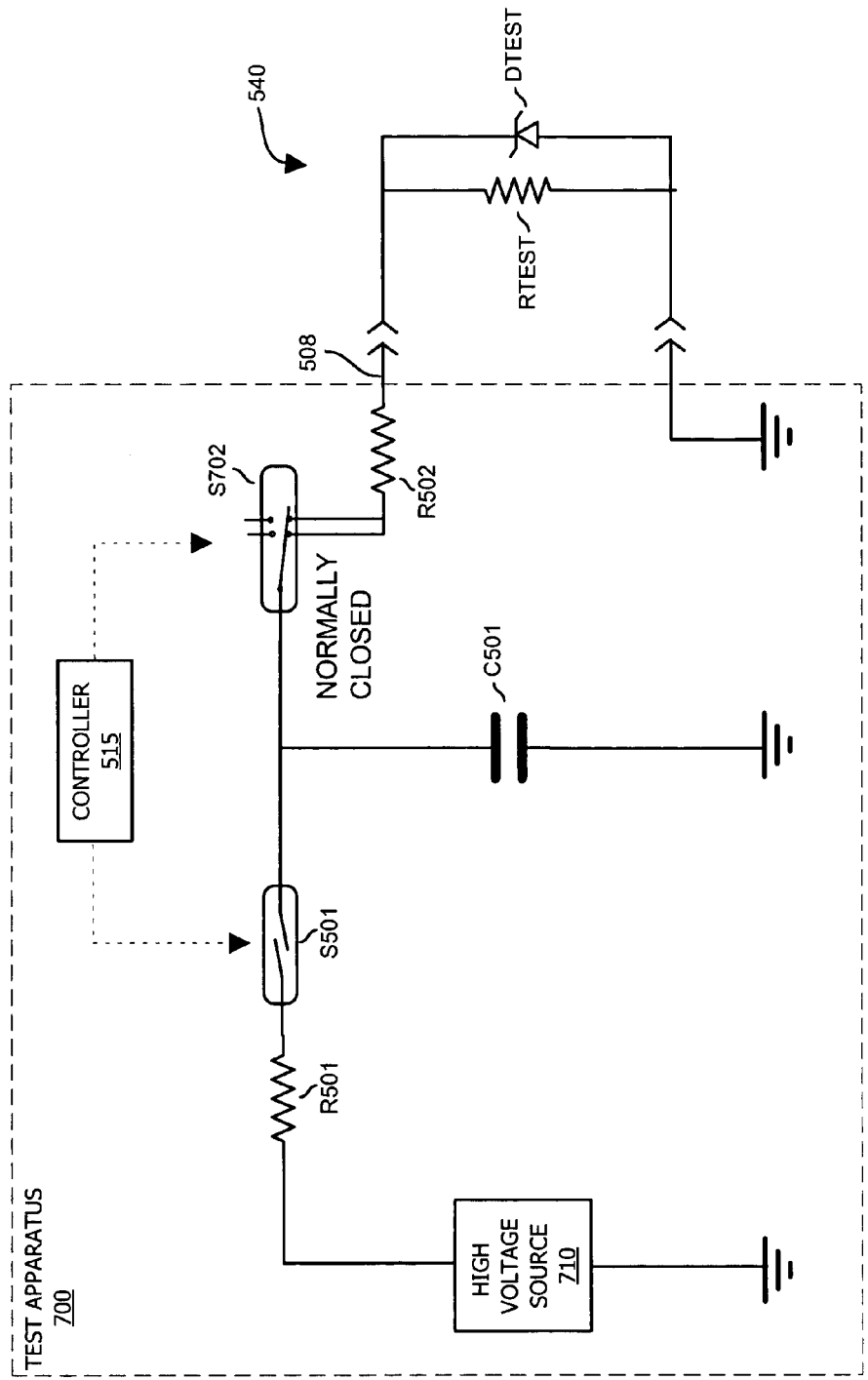
FIG. 7 is a circuit diagram of a test apparatus for generating a voltage pulse according to an embodiment of the invention.

FIG. 7 is a circuit diagram of test apparatus 700 for generating an output voltage test pulse applied over line 508 according to an embodiment of the invention. As shown, test apparatus 700 includes similar components as previously discussed for FIG. 5. Operation of test apparatus 700 is also similar as previously discussed. However, switch device S502 in FIG. 5 has been replaced with switch device S702 as shown in FIG. 7. Switch device S702 remains in a normally CLOSED position when no magnetic field is applied. Conversely, when an appropriate magnetic filed is applied, switch S702 is activated to an open position. Selection of whether to use a normally open or normally closed switch depends on the application.

As discussed, FIGS. 3–7 disclose techniques for testing components such as semiconductor devices. Notably, semiconductor device pin counts have increased dramatically. Consequently, the process of testing such devices can be time consuming, potentially requiring hours or even days to completely test all pins (each of which includes an overvoltage protection circuit) of a device. As mentioned, techniques discussed herein are particularly well-suited for producing highly repeatable (e.g., successively generated waveforms are very similar) simulated ESD test pulses without needlessly damaging components being tested.

In addition to repeatability, the test circuit according to embodiments of the invention is well-suited for use in manufacturing applications because it is inexpensive, reliable and has a fast recovery time. Another attribute of the test circuit is its small form factor. Because it is compact in size, a single test unit including many such test circuits may be housed in a relatively small space, yet at the same time providing a test manufacturer the ability to simultaneously test multiple pins or multiple semiconductor devices.

Characteristics of the switches (e.g., based on type) as well as placement of such switches in a test apparatus to generate the simulated ESD test pulse distinguish embodiments of the invention over conventional techniques. For example, unlike conventional techniques, mere use of both the first switch device S301 and second switch device S302 in the general embodiment of FIG. 3 (in lieu of a single switch as in MIL-STD-883E) provides for better isolation as opposed to a single switch as specified by MIL-STD-883E. Further, unlike conventional techniques, an embodiment of the invention employs use of a high voltage dry reed vacuum relay (a low leakage device) to selectively couple/decouple the power source 310 to/from the energy storage device 320, which stores energy to generate the simulated ESD test pulse. Use of the high voltage dry reed vacuum relay (e.g., as the switch device S301) provides better isolation of the power source 310 from the energy storage device 320, avoiding generation of unwanted residual voltage components in the simulated ESD test pulse.

While this invention has been particularly shown and described with references to preferred embodiments thereof, it will be understood by those skilled in the art that various changes in form and details may be made therein without departing from the spirit and scope of the invention as defined by the appended claims. As such, the foregoing description of embodiments of the invention is not intended to be limiting.

What is claimed is:

1. An apparatus to generate a voltage pulse for testing an electronic device susceptible to electrostatic discharge, the apparatus comprising:
a power source operable to generate a voltage signal;
an energy storage device operable to receive the voltage signal through a first switch device, the first switch device being operated to selectively couple the power source to the energy storage device;
a second switch device operable to couple the energy storage device to the electronic device, the second switch device supporting transfer of energy from the energy storage device to produce the voltage pulse for testing an electrostatic discharge protection circuit of the electronic device;
the first and second switch devices limiting a residual voltage component present in the voltage pulse after an initial discharge of energy stored in the energy storage device through the electrostatic discharge protection circuit, the residual voltage component being at a level low enough to result in substantial deactivation of the electrostatic discharge protection circuit of the electronic device to avoid damage; and
wherein the power source, the first switch device, the second switch device, and the energy storage device are operable in combination to generate the voltage pulse, said voltage pulse including a residual voltage component superimposed on a substantially exponential decay voltage component, the residual voltage component being below a predetermined threshold value based on characteristics of the first switch device.

2. An apparatus as in claim 1, wherein the voltage pulse simulates an ESD (Electrostatic Discharge) pulse.

3. An apparatus as in claim 2, wherein the simulated ESD pulse is based on a waveform as substantially specified in at least one of: MIL-STD-883E, EIA/JEDEC, JESD22-A114-B, and ESDA STM5.1 1998.

4. An apparatus as in claim 1 further comprising:
a controller to control the first switch device and the second switch device, the controller operable to perform sequential operations of:
i.) opening the second switch device to substantially decouple the energy storage device from the electronic device;
ii) closing the first switch device to substantially couple the power source to the energy storage device to charge the energy storage device;
iii.) opening the first switch device to substantially decouple the energy storage device from the power source; and
iv.) closing the second switch device to substantially couple the energy storage device to the electronic device to produce the voltage pulse.

5. An apparatus as in claim 4, wherein the controller is operable to generate a common control signal to simultaneously initiate steps iii.) and iv.).

6. An apparatus as in claim 1, wherein the residual voltage component, if otherwise above the predetermined threshold longer than an acceptable duration of time, would maintain an electrostatic discharge protection circuit of the electronic device in an active state and cause damage.

7. An apparatus as in claim 1, wherein the first switch device is operable to substantially decouple the power source from the energy storage device so that the residual voltage component is less than 0.4 volts.

8. An apparatus as in claim 1, wherein the electronic device is a semiconductor device including at least one electrostatic discharge protection circuit which is tested based on application of the voltage pulse to the semiconductor device.

9. An apparatus as in claim 1, wherein the first switch device is a high-voltage, dry reed vacuum relay device and the second switch device is a high-voltage, gas-filled mercury relay device.

10. An apparatus as in claim 1, wherein the second switch device includes a conductive throw lead that is selectively moved to a biased and unbiased position depending on application of a magnetic field;
the second switch device including a first contact and a second contact disposed in relation to a distal end of the conductive throw lead, the first contact being at least indirectly coupled to the energy storage device and the second contact being at least indirectly coupled to the electronic device;
the throw lead, while in the biased position, coupling the first contact to the second contact of the second switch device via a length of the conductive throw lead thereby completing a conductive path from the energy storage device through the first contact, through the length of the conductive throw lead, through the second contact to the electronic device; and
the throw lead, while in the unbiased position, decoupling the first contact from the second contact thereby preventing a flow of energy from the energy storage device to the electronic device through the length of the conductive throw lead.

11. An apparatus as in claim 1, wherein the first switch device is a reed relay device that provides isolation between the power source and the energy storage device when the second switch device is enabled to couple the energy storage device to the electronic device being tested.

12. An apparatus as in claim 11, wherein the first switch device is a dry reed vacuum relay device.

13. An apparatus as in claim 11, wherein the voltage signal produced by the power source is greater than 2000 volts.

14. An apparatus as in claim 13, wherein the residual voltage appears as a step voltage having a duration of up to 500 microseconds and being less than 0.4 volts, the step voltage being superimposed on the substantially exponential decay voltage component.

15. An apparatus as in claim 1, wherein the first switch device is operable to substantially decouple the power source from the energy storage device when the energy storage device delivers energy to test a respective electrostatic discharge protection circuit of the electronic device through the second switch device, the first switch device sufficiently isolating the power source from the energy storage device so that a level of the residual voltage component imparted by energy leaking from the power source through the switch device to the electrostatic discharge protection circuit is below a threshold of activating the electrostatic discharge protection circuit.

16. An apparatus as in claim 15, wherein the residual voltage appears as a step voltage having a duration of up to 500 microseconds and being less than 0.4 volts, the step voltage being superimposed on the substantially exponential decay voltage component and occurring after initial activation of the electrostatic discharge protection circuit.

17. An apparatus as in claim 10, wherein first contact and the second contact are both disposed at a same distal end of the conductive throw lead.

18. An apparatus as in claim 7, wherein voltage pulse is greater than 2000 volts and wherein the electronic is a semiconductor device.

19. An apparatus as in claim 18, wherein the residual voltage appears as a step voltage.

20. An apparatus to generate a voltage pulse for testing an electronic device susceptible to electrostatic discharge, the apparatus comprising:
a power source operable to generate a voltage signal;
an energy storage device operable to receive the voltage signal through a first switch device, the first switch device being operated to selectively couple the power source to the energy storage device;
a second switch device operable to couple the energy storage device to the electronic device, the second switch device supporting transfer of energy from the energy storage device to produce the voltage pulse for testing an electrostatic discharge protection circuit of the electronic device;
the first and second switches limiting a residual voltage component present in the voltage pulse after an initial discharge of energy stored in the energy storage device through the electrostatic discharge protection circuit, the residual voltage component being at a level low enough to result in substantial deactivation of the electrostatic discharge protection circuit of the electronic device to avoid damage; and
the apparatus further comprising a third switch device to shunt residual energy generated by the power source to ground while the second switch device is activated to couple the energy storage device to the electronic device to produce the voltage pulse.

21. A circuit for producing a simulated electrostatic discharge signal, the circuit comprising:
a power source;
a first switch device disposed between the power source and an energy storage device;
a second switch device having a first contact coupled to the energy storage device and a second contact coupled at least indirectly to an output terminal of the circuit; and
the first switch device and second switch device operable in relation to each other to produce a simulated electrostatic discharge signal having a first voltage component and a second voltage component, the first component being an exponential voltage decay component, the second voltage component having a voltage level below a cutoff voltage threshold to avoid damaging an electronic device that receives the simulated electrostatic discharge signal through the output terminal; and
wherein the first switch device is a high-voltage, dry reed vacuum relay device and the second switch device is a high-voltage, gas-filled mercury relay device.

22. A circuit as in claim 21, wherein the second voltage component has a voltage level below the cutoff voltage threshold, above which the second voltage component would otherwise maintain activation of an electrostatic discharge protection circuit in the electronic device that receives the simulated electrostatic discharge signal.

23. A circuit as in claim 21, wherein the first switching device is a reed relay device and the energy storage device is a capacitor.

24. A circuit as in claim 21, wherein the first switch device and second switch device are operable to produce an exponential decay voltage waveform during a short circuit condition of the output terminal to ground, operation of the first switch and second switch devices otherwise producing the simulated electrostatic discharge signal including the first voltage component and the second voltage component during a non-short circuit condition.

25. A circuit as in claim 24, wherein the non-short circuit condition includes at least a partially resistive load coupled to the output terminal.

26. A circuit as in claim 21, wherein the simulated electrostatic discharge signal is greater than 2000 volts and the electronic circuit is a semiconductor device.

27. A method of generating a voltage pulse for testing an electronic device susceptible to electrostatic discharge, the method comprising:
generating a voltage signal above 500 volts;
setting a first switch device to a closed state to couple the voltage signal to charge an energy storage device;
setting the first switch device to an open state to decouple the voltage signal from the energy storage device; and
setting a second switch device to a closed state to couple energy stored in the energy storage device to test a protection circuit of the electronic device, coupling energy stored in the energy storage device to the protection circuit resulting in generation of a simulated electrostatic discharge voltage pulse including a residual voltage component superimposed on a substantial exponential decay voltage component, the residual voltage component being below a predetermined threshold to prevent the protection circuit of the electronic device from being damaged; and
shunting residual energy generated by a power source generating the voltage signal so as to prevent the residual voltage component from exceeding the predetermined threshold.

28. A method as in claim 27, wherein producing the simulated electrostatic discharge voltage pulse includes simulating an electrostatic discharge waveform as substantially specified in at least one of: MIL-STD-883E, EIA/JEDEC JESD22-A114-B, and ESDA STM5.1 1998.

29. A method as in claim 27, wherein setting the first switch device to an open state and setting the second switch device to a closed state involves:
generating a control signal to simultaneously set the first switch device to the open state and the second switch device to the closed state.

30. A method as in claim 27, wherein the residual voltage component, if otherwise above the predetermined threshold longer than an acceptable duration of time, would maintain an electrostatic discharge protection circuit of the electronic device in an active state and cause damage.

31. A method of manufacturing a voltage pulse generator for testing an electronic device susceptible to electrostatic discharge, the method comprising:
interconnecting a power source, a first switch device, a second switch device, and an energy storage device to produce the voltage pulse generator operable to support generation of a simulated electrostatic discharge voltage pulse;
enabling the first switch device to electrically couple a voltage signal generated by the power source to charge an energy storage device; and
enabling the second switch device to electrically couple energy stored in the energy storage device to the electronic device while the voltage signal is simultaneously decoupled from the energy storage device, operation of the first and second switches limiting a residual voltage component present in the voltage pulse after an initial discharge of energy stored in the energy storage device through the electrostatic discharge protection circuit, the residual voltage component being at a level low enough to result in substantial deactivation of the electrostatic discharge protection circuit of the electronic device to avoid damage; and
providing the first switch device to be a high-voltage, dry reed vacuum relay device and the second switch device to be a high-voltage, gas-filled mercury relay device.

32. A method as in claim 31 further comprising:
providing the second switch device, which includes a conductive throw lead that selectively moves to a biased and unbiased position depending on application of a magnetic field;
the second switch device including a first contact and a second contact disposed in relation to a distal end of the conductive throw lead, the first contact being at least indirectly coupled to the energy storage device and the second contact being at least indirectly coupled to the electronic device;
the throw lead, while in the biased position, coupling the first contact to the second contact of the second switch device via a length of the conductive throw lead thereby completing a conductive path from the energy storage device through the first contact, through the length of the conductive throw lead, through the second contact to the electronic device; and
the throw lead, while in the unbiased position, decoupling the first contact from the second contact to prevent a flow of energy from the energy storage device to the electronic device.

* * * * *